United States Patent [19]

Leuenberger

[11] Patent Number: 4,470,024
[45] Date of Patent: Sep. 4, 1984

[54] INTEGRATED CIRCUIT FOR A CONTROLLABLE FREQUENCY OSCILLATOR

[75] Inventor: Claude-Eric Leuenberger, Chezard, Switzerland

[73] Assignee: Asulab S.A., Bienne, Switzerland

[21] Appl. No.: 357,870

[22] Filed: Mar. 15, 1982

[30] Foreign Application Priority Data

Mar. 24, 1981 [FR] France .................. 81 06050

[51] Int. Cl.³ .................. H03B 5/36; H03J 3/18
[52] U.S. Cl. .................. 331/108 D; 331/116 FE; 331/177 V; 357/41; 357/51
[58] Field of Search ............ 331/36 C, 108 C, 108 D, 331/116 R, 116 FE, 177 V; 357/41, 51

[56] References Cited

U.S. PATENT DOCUMENTS 4,139,826 2/1979 Pradal .................. 331/177 V
4,214,252 7/1980 Goerth .................. 357/14

FOREIGN PATENT DOCUMENTS 2842646 4/1980 Fed. Rep. of Germany ... 331/177 V

Primary Examiner—Siegfried H. Grimm
Assistant Examiner—Robert Pascal
Attorney, Agent, or Firm—Spensley, Horn, Jubas & Lubitz

[57] ABSTRACT

An integrated circuit for a controllable frequency oscillator using integrated variable-capacitance capacitors.

The circuit is a MOS type. Each of the variable capacitance capacitors comprises a n+-p junction at the interface of a first region of n+ conductivity type and a second region of p conductivity type, which are formed in a semiconductor substrate of n type. The first and second regions emerge at the surface of the semiconductor wafer. A decoupling capacitor is associated with the variable-capacitance capacitor by the formation of a stack arrangement comprising the portion of insulating oxide layer covering the surface portion of the wafer at which said first region emerges and an electrically conducting layer covering said insulating layer portion.

8 Claims, 5 Drawing Figures

INTEGRATED CIRCUIT FOR A CONTROLLABLE FREQUENCY OSCILLATOR

FIELD OF THE INVENTION

The present invention concerns oscillator circuits and, more particularly, a single chip integrated circuit adapted to establish and sustain the oscillations of a resonator. The integrated circuit is provided with means for adjusting the frequency of the oscillations of the resonator.

BACKGROUND OF THE INVENTION

In order to be able to regulate, as desired, the frequency of oscillation of an oscillator circuit of the PIERCE type, i.e. a crystal oscillator having two capacitors, each of which is connected between the crystal resonator and the common or ground terminal of the circuit, it has already been proposed that these capacitors normally incorporated in the integrated circuit should be replaced by controllable-capacitance capacitors in the form of discrete components which are connected to suitable terminals of the integrated circuit.

Accompanying FIG. 1 shows an application of that known design to an oscillator of the type described in U.S. Pat. No. 4,013,979.

The circuit shown in FIG. 1 comprises an integrated circuit 1 of CMOS type, a quartz resonator 2, an electrical power supply source 3 and two circuits 4a and 4b which are formed from discrete components and which comprise capacitors 5a and 5b, respectively, of the type having a capacitance which varies continuously in dependence on the voltage applied thereto.

The integrated circuit 1 comprises a pair of terminals 6 and 7 which are connected to the power supply source 3, and a second and a third pair of terminals as shown at 8a, 8b and 9a, 9b for connection to the respective circuits 4a and 4b.

The integrated circuit 1 comprises a MOS transistor 10, for example a n-channel transistor, which is polarized by a resistor 11 connected between the gate 10a and the drain 10b of the transistor 10, the source of which is indicated by reference numeral 10c. The current flowing in the controlled current path, or drain-source path, of the transistor 10 is determined by a current source 12 for example a p-channel MOS transistor, which is connected in series with said drain-source path between the supply terminals 6 and 7 of the integrated circuit 1. The source 12 provides a current controllable in dependence on a control signal applied to its control input 12a which is for example the gate of said p-channel transistor. This control signal is supplied by a regulator circuit 13 responsive to the oscillation signal present at the gate 10a of the transistor 10. The circuit 13 is designed for supplying a control signal which is a suitable function of the amplitude of said oscillation signal, whereby the circuit 13 and the current source 12 form a regulating loop circuit for limiting the amplitude of the oscillating signal to a low value. U.S. Pat. No. 4,013,979 shows several embodiments for the regulator circuit 13.

One plate of each capacitor 5a and 5b is connected to the terminals 8b and 9b, respectively. The other plates 50a, 50b of the capacitors 5a, 5b, respectively, are connected, via a decoupling capacitor 16a and 16b, respectively, to the terminals 8a and 9a, respectively, of the integrated circuit 1. The terminals 8b and 9b are connected to the negative one 7 of the supply terminals, which is the common- or ground-terminal of the circuit. Matching resistors 15a and 15b are interposed between control terminals 14a and 14b, respectively, and the plates 50a and 50b, respectively, of the capacitors 5a and 5b, respectively. Each plate 50a and 50b is also connected to a respective terminal 2a and 2b, respectively, for connection to the quartz 2. Finally, the decoupling capacitors 16a and 16b are interposed between the terminals 8a and 9a, respectively, and the common points A and B, respectively, between the resistors 15a and 15b, respectively, and the capacitors 5a and 5b, respectively.

Thus, it is possible to adjust the capacitance of each of the capacitors 5a and 5b by applying a suitable control voltage Ua and Ub between the common terminal 7 and respective control terminals 14a and 14b of the respective circuits 4a and 4b.

The applicant has found that the circuit shown in FIG. 1 does not generally prove satisfactory by virtue of the narrowness of the range of frequency values at which the oscillator can be set, and also by virtue of a relatively high level of current consumption. The first disadvantage referred to above is primarily due to the parasitic capacitances represented in FIG. 1 by references C1a, C2a, C3a and C1b, C2b and C3b which capacitances are liable to short-circuit the respective capacitors 5a and 5b, in the high-frequency mode. It has been found that essentially parasitic capacitances C1a and C2a and C1b and C2b are of relatively high values; this is because the circuits 4a and 4b comprise discrete components.

Further, German Pat. No. 2.638.055 discloses a crystal oscillator provided with means for adjusting the frequency of the oscillations of the crystal. This adjusting means comprises a set of capacitors of the type known in the literature as "Bicap". It is known that such a capacitor may have one or the other of two different values depending on whether or not the voltage applied to it exceeds a threshold value.

Thus the frequency of this known oscillator is adjusted in a discontinuous manner. Furthermore, the circuit according to this prior art is rather complicated and expensive because it needs a large number of Bicaps in order to be able to set the frequency over a wide range of values.

Accordingly one object of the present invention is to propose a novel circuit for establishing and sustaining the oscillations of a resonator, which circuit permits adjustment of the frequency of oscillation of the resonator over a sufficiently wide range of values, for example with a range $\Delta f/f$ of the order of $\pm 200$ ppm, at high frequencies, in particular of the order of from a few MHz to 20 MHz, for example 16 MHz which is a typically used telecommunication frequency.

BRIEF SUMMARY OF THE INVENTION

In accordance with the invention, the continuously variable-capacitance capacitors in the form of discrete components, or the set of Bicaps of the prior art are replaced by at least one variable-capacitance capacitor which is integrated in a single chip- or wafer-integrated circuit forming the sustaining circuit of the resonator. The plate which is opposite to the electrical power supply source of the capacitor is connected to a control terminal of the integrated circuit. This terminal is for receiving a control signal, for example a d.c. voltage signal for setting the capacitance of the capacitor, and therefore adjusting the frequency of oscillation of the oscillator circuit. To this effect, the capacitor is arranged so that a d.c. voltage, the value of which depends on the control signal, is applied across it. For example, one of the plates of the capacitor is connected via a resistor to the control terminal while the other plate of the capacitor is connected to the common or ground terminal of the circuit.

Thus the circuit according to the invention permits a continuous setting of the frequency of oscillation of the resonator over a wide range of values while using only one variable capacitance capacitor.

According to a preferred embodiment of the invention, the integrated sustaining circuit is of MOS type. The variable-capacitance capacitor comprises a $n^+$-p junction at the interface of a first region of $n^+$ conductivity type and a second region of p conductivity type. The second region is a caisson of p type formed in a semi-conductor substrate of n type and the first region is a diffusion portion of $n^+$ type formed in a superficial zone of said caisson. The second p-type region is connected to the terminal which is to be connected to the negative pole of the electrical power supply source. The first and second regions emerge at the surface of the semi-conductor wafer. A decoupling capacitor necessary for achieving a good operation of the circuit is formed by the portion of insulating oxide layer which covers the surface portion of the wafer at which said first region of $n^+$ conductivity type emerges, the insulating layer portion being covered by an electrically conducting layer.

BRIEF DESCRIPTION OF THE DRAWINGS

The features and advantages of the invention will be more clearly appreciated from the following description of several embodiments, with reference to the accompanying drawings in which.

DETAILED DESCRIPTION OF THE PREFERRED EMBODIMENTS

Figure 1:
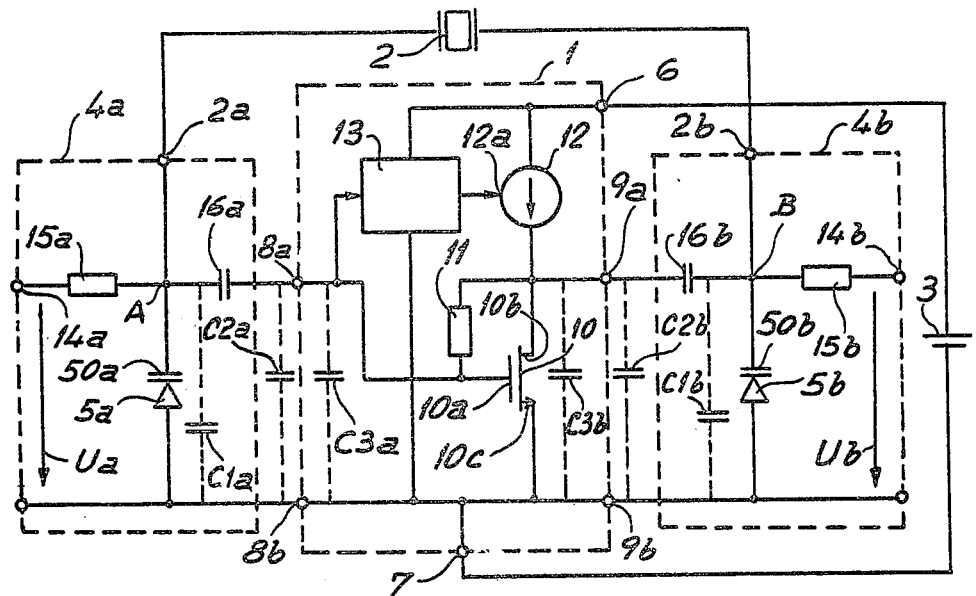
FIG. 1, which has already been described, shows the electrical circuit diagram of an oscillator of the prior art using continuously variable-capacitance capacitors in the form of discrete components.
Figure 2:
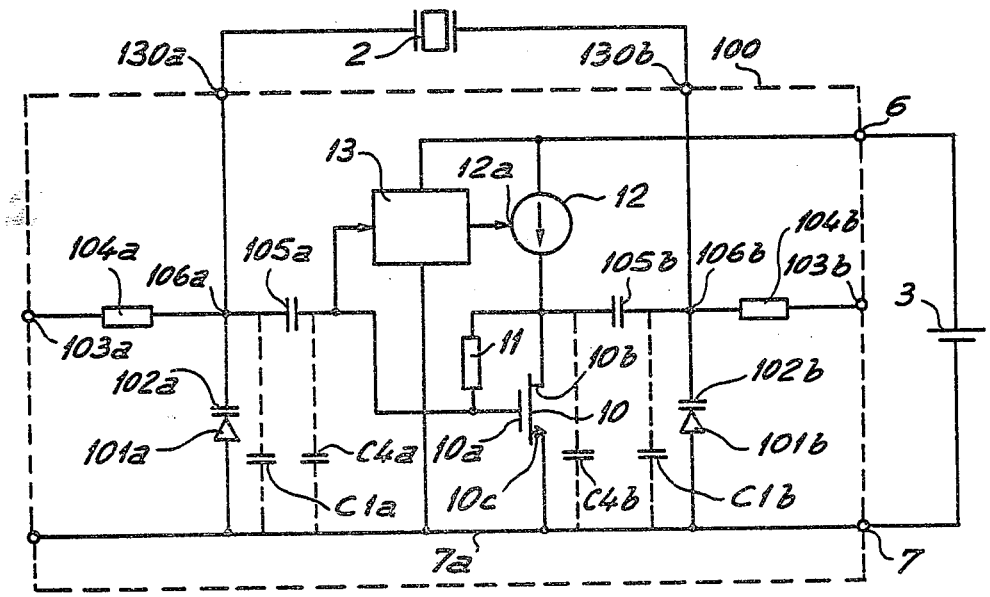
FIG. 2 is an electrical circuit diagram of an integrated circuit for establishing and sustaining the oscillations of a resonator, in one embodiment of the invention.

In FIG. 2, elements which are identical or similar to those in FIG. 1 are denoted by the same references. FIG. 2 shows an integrated circuit wafer 100 which, like the wafer 1 shown in FIG. 1, comprises a pair of output terminals 6 and 7 for connection to an electrical d.c. power supply source 3, and circuit elements 10 to 13, the mode of operation of which is similar to that of the elements denoted by the same references, as described with reference to FIG. 1.

The integrated circuit 100 further comprises two variable-capacitance capacitors 101a and 101b of the type having a capacitance which varies continuously in dependence on the voltage applied thereto. Each of these capacitors is integrated into the I.C. 100 and is connected between the supply terminal 7 and a respective one of two output terminals 130a and 130b of the circuit 100. These output terminals are provided in the I.C. 100 for connecting thereto the quartz resonator 2. The plates 102a and 102b respectively, being the plates disposed opposite the supply terminal 7, are connected to respective control terminals 103a and 103b of the integrated circuit 100, by way of resistors 104a and 104b, respectively, which are also integrated into the I.C. 100.

The decoupling capacitor 105a is interposed between the junction point 106a of the resistor 104a and the capacitor 101a and the gate 10a of the transistor 10. The other decoupling capacitor 105b is interposed between the junction point 106b of the resistor 104b and the capacitor 101b and the drain 10b of the transistor 10.

In order to facilitate comparing FIGS. 1 and 2, references C1a and C1b in FIG. 2 denote the parasitic capacitances between the terminals of the capacitors 101a and 101b, respectively, while references C4a and C4b denote the parasitic capacitances between the common conductor 7a which is connected to the supply terminal 7, and the plates adjacent to the transistor 10 of the decoupling capacitors 105a and 105b, respectively. It will be appreciated that the parasitic capacitances C4a and C4b are each equivalent to the assembly formed by the parasitic capacitances C2a and C3a, and C2b and C3b, respectively, which are connected in parallel as shown in FIG. 1.

The applicant has found that replacing the capacitors 5a and 5b in FIG. 1 by the capacitors 101a and 101b in the circuit 100 makes it possible to derive the maximum benefit from the extent of the range of variation in the capacitance of the capacitors 101a and 101b and to achieve a range $\Delta f/f$ of the order of $\pm 100$ ppm, which can be up to $\pm 250$ ppm, at frequencies of between 10 and 20 MHz. This surprising result can be explained in part by the fact that the parasitic capacitances C1a and C4a and C1b and C4b are considerably reduced, by virtue of the capacitors 101a and 101b being integrated into the circuit 100.

In addition, integrating the variable-capacitance capacitors makes it possible substantially to reduce the size of the complete oscillator circuit and also the electrical power consumption of the circuit.

Figure 3:
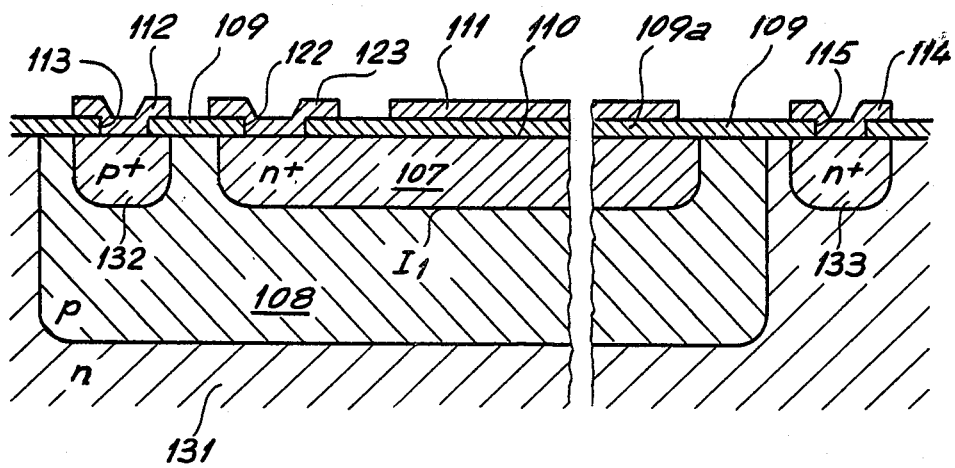
FIG. 3 is a view in cross-section through an integrated circuit wafer providing a variable capacitor associated with a decoupling capacitor, in one embodiment.
Figure 4:
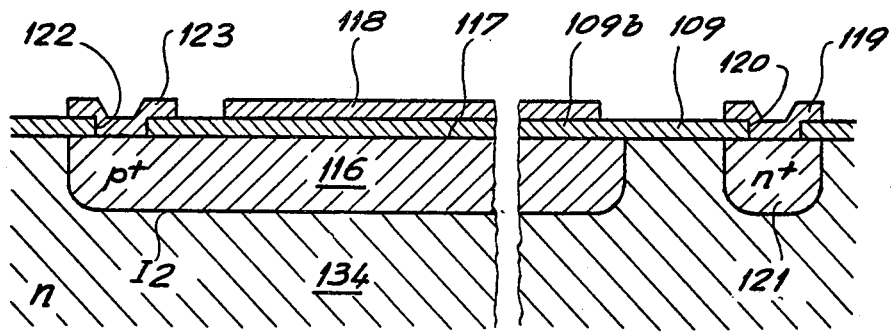
FIG. 4 is a view similar to that shown in FIG. 3, illustrating a second embodiment of said association of capacitors.

Reference will now be made to FIGS. 3 and 4 to describe two embodiments of MOS type, of a variable capacitor such as the capacitor 101a or 101b, associated with a decoupling capacitor such as capacitor 105a or capacitor 105b, respectively, the embodiment shown in FIG. 3 being directly applicable to the circuit 100 shown in FIG. 2.

In the embodiment shown in FIG. 3, each capacitor 101a and 101b of the circuit shown in FIG. 2 comprises a $n^+$-p junction at the interface $I_1$ between a diffusion portion 107 of type $n^+$ and a bulk layer- or caisson-108 of type p, which are formed in a substrate 131 of type n of a semiconductor silicon wafer. A silica layer 109 covers the upper surface of the wafer.

The decoupling capacitors 105a and 105b which are associated with the variable-capacitance capacitors 101a and 101b, respectively, are each formed by the portion 109a of the silica layer which covers the surface region 110 at which the diffusion portion 107 emerges. An electrically conducting layer 111, for example a layer of aluminium or a layer of polycrystalline silicon which is heavily doped, forms a plate of the respective decoupling capacitor 105a and 105b, the other plate of which is formed by the n+ diffusion portion 107 itself.

The negative supply terminal 6 may be formed by an electrically conducting layer 112 covering a window 113 formed in the silica layer 109 in line with a diffusion portion 132 of type p+ which is formed in the caisson 108. The other supply terminal 7 may be formed by a deposited conducting layer 114 which covers a window 115 formed in the layer 109 in line with a diffusion portion 133 of type n+ which is formed in the n type substrate 131 of the semi-conductor wafer forming the integrated circuit 100.

In the embodiment shown in FIG. 4, a variable-capacitance capacitor is formed by a n-p+ junction at the interface $I_2$ between a diffusion portion 116 of p+ type and a semiconductor substrate 134 of type n. As in the case of FIG. 3, the decoupling capacitor associated with the capacitor $I_2$ is formed by the portion 109b of insulating layer which covers the surface region 117 at which the diffusion portion 116 emerges. An electrically conducting layer 118 covering said portion 109b forms a plate of the decoupling capacitor, the other plate of which is formed by p+ diffusion portion 116 itself.

One supply terminal which is directly connected to a plate of the capacitor ($I_2$) may be a conducting layer 119 covering a window 120 formed in the layer 109 in line with a diffusion portion 121 of type n+ which is formed in the n type substrate 134. However, in order for the n-p+ junction between the regions 134 and 116 to be correctly polarized, the supply terminal 119 must be connected to the positive pole of the electrical power supply source 3, in contrast to the arrangement shown in FIG. 2.

Thus, when the variable-capacitance capacitors 101a and 101b are designed in accordance with the construction shown in FIG. 4, the diagram of the circuit 100 in FIG. 2 would have to be slightly altered, by reversing the polarity of the power supply source 3 and by using a correct transistor and a correct source of current in place of transistor 10 and source 12, respectively.

In the construction shown in FIG. 3, as in the case of FIG. 4, the conducting layers 111 and 118 respectively forming a plate of the decoupling capacitor preferably extend over almost the entire extent of the respective junctions $I_1$ and $I_2$. It has been found in fact that this characteristic enables the value of the parasitic capacitance occurring at the terminals of the variable-capacitance capacitors $I_1$ and $I_2$ respectively to be reduced to the minimum.

However, it is desirable to leave a small marginal part of the insulating layer portion 109a and 109b respectively free, in order to provide therein a window 122 which is covered by an electrically conducting layer 123 providing a contact means in respect of the junction point such as the point 106a or 106b in the circuit 100, between the decoupling capacitor and the variable-capacitance capacitor (FIGS. 3 and 4).

Figure 5:
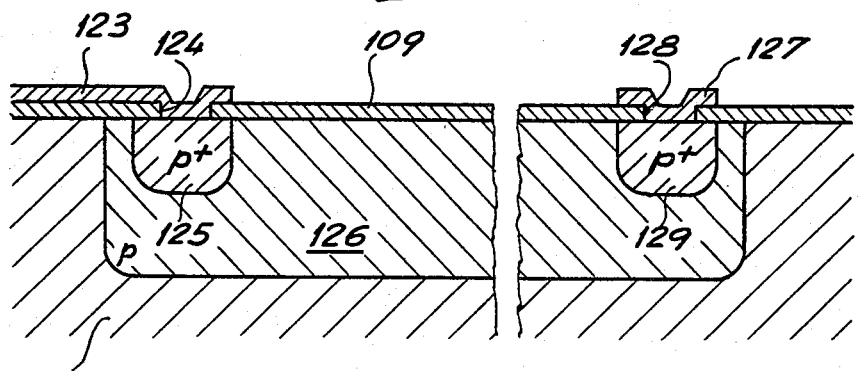
FIG. 5 is a view in cross-section through an integrated circuit portion forming a resistor, which can be used in the circuit shown in FIG. 2.

FIG. 5 shows an embodiment of an integrated resistor, one of the terminals of which is connected to the junction point between the capacitors ($I_1$) and (107, 109a, 111) and ($I_2$) and (116, 109b, 118) respectively.

In this embodiment, the electrically conducting layer 123 extends to a position in line with another window 124 provided in the silica layer 109 in line with a p+ diffusion portion 125 disposed at one end of a caisson 126 of type p, which is formed in the substrate 131 or 134 of type n. The portion 126 forms the resistor such as that indicated at 104a or 104b in FIG. 2. One of the terminals of the resistor is the layer 123 which covers the window 124; the other terminal of that resistor comprises an electrically conducting layer 127 covering a window 128 in the silica layer 109; the window 128 is disposed in line with a p+ diffusion portion 129 which is at the end of the portion 126 remote from the diffusion portion 125.

The layer 127 forms an output terminal of the integrated circuit such as the terminals 103a or 103b of the integrated circuit shown in FIG. 2.

It will be appreciated that the integrated resistors 104a and 104b of the circuit 100 shown in FIG. 2 may be produced using another design principle; for example these resistors can be formed by a system of diodes formed in a poly-crystalline silicon layer forming the electrically conducting layers of the integrated circuit designed according to the so-called silicon-gate technology. Alternatively, the resistors 104a and 104b may each be formed by a suitable polarized MOS transistor.

Moreover, one of the capacitors 101a or 101b of the circuit 100 may be of fixed capacitance, in which case the decoupling capacitor (105a and 105b), the resistor (104a and 104b) and the control terminal (103a and 103b) which are associated with the respective fixed capacitor may be omitted.

Further, the circuit 100 may be of a type other than the PIERCE type presently disclosed.

The present invention can be used in particular for oscillators which are controlled by a voltage signal, and which are used in frequency modulation telecommunication equipment.

The invention can also be employed in electronic watches or in telecommunication equipment using an oscillator, the frequency of which is to be corrected in dependence on the temperature of the resonator of the oscillator.

While there are shown and described several preferred illustrative embodiments of the invention, it will be understood by those skilled in the art that other modifications may be made within the principles of the invention and the scope of the appended claims.

What is claimed is:

1. A single chip MOS integrated circuit for a controllable frequency oscillator comprising:
    a semiconductor substrate of one type of conductivity;
    two first terminals for connection to a resonator;
    two second terminals for connection to an electrical power supply source; and
    a circuit formed on said semiconductor substrate and connected to said first and second terminals for establishing and sustaining the oscillations of a resonator connected to said two first terminals, said circuit comprising at least one active element connected to said first and second terminals, at least one control terminal, and means connected to said active element and said control terminal for adjusting the frequency of the oscillation of the resonator in dependence on a control signal applied to said control terminal, said adjusting means comprising:
    at least one adjustable capacitor having a capacitance which varies continuously in dependence on a voltage applied thereto, said capacitor being connected to said active element for determining the frequency of the oscillations of the resonator in dependence on said capacitance, said adjustable capacitor comprising a first and a second semiconductor region of opposite conductivity types arranged relative to each other for forming a junction therebetween, said second semiconductor region being a diffusion portion formed in a superficial zone of said chip; and means responsive to said control signal for applying to said adjustable capacitor a voltage, the value of which is determined in dependence on said control signal; and further comprising:

a decoupling capacitor connected between said adjustable capacitor and said active element, said decoupling capacitor comprising an insulating layer covering one of said regions and an electrically conducting layer for covering said insulating layer, said chip having an oxide layer, said insulating layer being a portion of said oxide layer.

2. The chip of claim 1, wherein said first region is a bulk layer of the type of conductivity opposite to said one type of conductivity, said bulk layer being formed in said semiconductor substrate, and said second region is a diffusion portion of said one type of conductivity formed in said bulk layer.

3. The chip of claim 1, wherein said first region is said semiconductor substrate and said second region is a diffusion portion of the type of conductivity opposite to said one type, said diffusion portion being formed in said semiconductor substrate.

4. The chip of claim 1, wherein said insulating and conducting layers extend substantially over the whole surface of said junction.

5. The chip of any of claims 1, 3 or 4, wherein said first region is electrically connected to a first one of said second terminals and said second region is electrically connected to said control terminal.

6. The chip of claim 5, further comprising a resistor interposed between said control terminal and said second region.

7. The chip of any of claims 2 or 3, wherein said first and said second region are of p type and of n+ type respectively.

8. The chip of any of claims 2 or 3, wherein said first and said second region are of n type and of p+ type respectively.

* * * * *